United States Patent
Jung et al.

(10) Patent No.: US 7,636,145 B2
(45) Date of Patent: Dec. 22, 2009

(54) DISPLAY APPARATUS AND METHOD OF MANUFACTURING THE SAME

(75) Inventors: Jin-Goo Jung, Seoul (KR); Chun-Gi You, Hwaseong-Si (KR); Chul-Ho Kim, Seoul (KR); Kyung-Min Park, Seongnman-si (KR); Il-Gon Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 693 days.

(21) Appl. No.: 11/353,823

(22) Filed: Feb. 14, 2006

(65) Prior Publication Data

US 2006/0181218 A1 Aug. 17, 2006

(30) Foreign Application Priority Data

Feb. 16, 2005 (KR) .................... 10-2005-0012660

(51) Int. Cl.
*G02F 1/1345* (2006.01)
(52) U.S. Cl. .................. 349/149; 349/150; 349/151; 349/152
(58) Field of Classification Search .......... 349/149–152
See application file for complete search history.

(56) References Cited

U.S. PATENT DOCUMENTS

| | | | | |
|---|---|---|---|---|
| 6,738,109 B2* | 5/2004 | Jeon | .............................. | 349/43 |
| 6,771,348 B2* | 8/2004 | Oh et al. | ...................... | 349/152 |
| 6,784,457 B2* | 8/2004 | Yamazaki et al. | .............. | 257/72 |
| 6,937,314 B2* | 8/2005 | Kim | ............................ | 349/149 |
| 6,970,222 B2* | 11/2005 | Nakayoshi et al. | ........... | 349/139 |
| 6,985,193 B2* | 1/2006 | Jang | ............................ | 349/43 |
| 7,053,972 B2* | 5/2006 | Lim | ............................ | 349/152 |
| 7,133,039 B2* | 11/2006 | Moon et al. | .................. | 345/211 |
| 7,230,271 B2* | 6/2007 | Yamazaki et al. | .............. | 257/72 |
| 7,443,479 B2* | 10/2008 | Hong et al. | .................. | 349/149 |
| 2002/0053668 A1 | 5/2002 | Kim | | |
| 2002/0067452 A1 | 6/2002 | Sakamoto et al. | | |

* cited by examiner

*Primary Examiner*—Brian M. Healy
*Assistant Examiner*—Guy G Anderson
(74) *Attorney, Agent, or Firm*—F. Chau & Associates, LLC

(57) ABSTRACT

In a display apparatus and a manufacturing method of the display apparatus, the display apparatus includes a display panel having signal lines and an insulating layer, and a signal generator electrically connected to the signal lines and adhering to the display panel. The signal lines include pads formed at ends thereof, respectively. The organic insulating layer is partially removed such that the via holes are formed between the pads of the signal lines to reduce a step-difference between an area in which the pads are formed and an area in which the pads are not formed. Thus, the display apparatus may enhance the coupling force between the signal generator and the display panel.

14 Claims, 9 Drawing Sheets

DISPLAY APPARATUS AND METHOD OF MANUFACTURING THE SAME

CROSS-REFERENCE TO RELATED APPLICATION

This application claims priority to Korean Patent Application No. 2005-12660, filed on Feb. 16, 2005, the content of which is hereby incorporated by reference in its entirety.

BACKGROUND OF THE INVENTION

1. Field of the Invention

The present invention relates to a display apparatus and a method of manufacturing the same. More particularly, the present invention relates to a display apparatus capable of improving production yield and a method of manufacturing the display apparatus.

2. Description of the Related Art

In general, a liquid crystal display apparatus displays an image using optical and electrical properties of liquid crystal, such as an anisotropic refractive index and an anisotropic dielectric constant. The liquid crystal display apparatus requires a backlight assembly since its display panel is not self-emissive. The backlight assembly supplies the light source for the liquid crystal display panel displaying the image thereon.

The liquid crystal display panel includes gate lines and data lines to transmit an image signal. The liquid crystal display panel receives the image signal from a driving chip and a flexible printed circuit board coupled thereto through the gate and data lines.

The gate and data lines include a pad formed at ends thereof and electrically connected to the driving chip and the flexible printed circuit board. The pad includes an insulating layer formed on an upper face thereof and a transparent electrode formed on the insulating layer. The insulating layer is partially removed to form a via hole such that the pad is exposed through the via hole. When removing the pad, the insulating layer remains between the pad and an adjacent pad. This occurs because the transparent electrode is easily separated from a lower layer thereunder when the insulating layer is completely removed from an area where the flexible printed circuit board is attached to the liquid crystal display panel.

The transparent electrode is electrically connected to the pad through the via hole. The driving chip and the flexible printed circuit board disposed on the transparent electrode and electrically connected thereto are attached to the liquid crystal display panel by means of an anisotropic conductive film.

However, the via hole of the insulating layer is formed using a slit mask, so that the insulating layer has a slit shape. Thus, the anisotropic conductive film is easily separated from the liquid crystal display panel due to a step-difference between the via hole area and a peripheral area adjacent to the via hole area. As a result, the driving chip and the flexible printed circuit board are electrically opened with the pad; therefore, the liquid crystal display apparatus displays the image abnormally.

SUMMARY OF THE INVENTION

In one exemplary embodiment of the present invention, a display apparatus includes a display panel and a signal generator. The display panel includes a substrate having a first area to display an image in response to an image signal, a second area adjacent to the first area, and a plurality of signal transmitting lines to transmit the image signal. The signal transmitting lines are formed on the substrate and include pads formed at ends thereof, respectively. The insulating layer is formed on the substrate to cover the signal transmitting lines. The insulating layer is partially removed from a corresponding area between the pads so as to form a first via hole. The signal generator applies the image signal to the signal transmitting lines and is formed in the second area and electrically connected to the pad.

In another exemplary embodiment of the present invention, a method of manufacturing a display apparatus is provided. According to the method, a plurality of signal transmitting lines is formed on a substrate to transmit an image signal. The substrate has a first area displaying an image in response to the image signal and a second area adjacent to the first area. An insulating layer is formed on the substrate to cover the signal transmitting lines. The insulating layer is partially removed from a corresponding area between the pads so as to form a first via hole. A signal generator is mounted on the substrate corresponding to the second area so as to transmit the image signal to the signal transmitting lines.

Accordingly, the step-difference between the areas in which the pads are formed and the areas in which the pads are not formed may be reduced due to the via hole. Thus, the display apparatus according to exemplary embodiments of the present invention may enhance the coupling force between the signal generator and the display panel and improve production yield thereof.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF EXEMPLARY EMBODIMENTS

Hereinafter, exemplary embodiments of the present invention will be described in detail with reference to the accompanying drawings.

Figure 1:
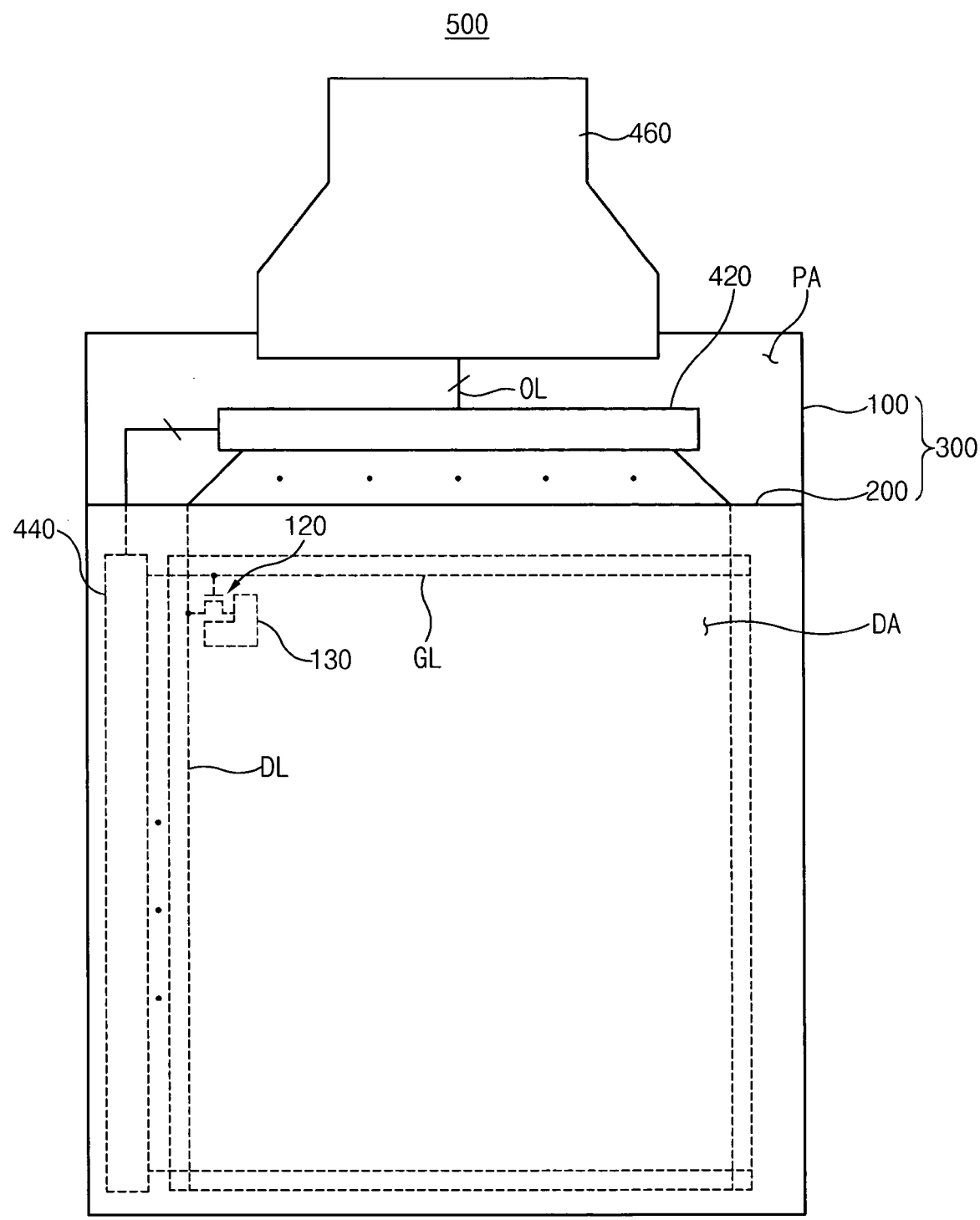
FIG. 1 is a plan view showing a liquid crystal display apparatus according to an exemplary embodiment of the present invention.

FIG. 1 is a plan view showing a liquid crystal display apparatus according to an exemplary embodiment of the present invention. Referring to FIG. 1, a liquid crystal display apparatus 500 includes a liquid crystal display panel 300 that displays an image using an image signal, a driving chip 420 that outputs data and gate control signals to drive the liquid crystal display panel 300, a gate driving circuit 440 that outputs a gate signal in response to the gate control signal, and a flexible printed circuit board 460 that applies the image signal to the driving chip 420.

The liquid crystal display panel 300 is divided into a display area DA on which an image is displayed and a peripheral area PA on which the image is not displayed that is adjacent to the display area DA. The liquid crystal display panel 300 includes a first substrate 100, a second substrate facing the first substrate 200, and a liquid crystal layer (not shown) disposed between the first and second substrates 100 and 200.

The first substrate 100 includes a plurality of data lines DL to transmit a data signal, a plurality of gate lines GL substantially perpendicular to the data lines DL to transmit a gate signal, a plurality of thin film transistor (TFT) connected to the data and gate lines DL and GL, and a pixel electrode 130 connected to the TFT 120. The data lines DL transmit the data signal applied from the driving chip 420. Although not shown, each of the data lines DL includes a pad formed at an end thereof and each is electrically connected to the driving chip 420. The gate lines GL are electrically connected to the gate driving circuit 440 and transmit the gate signal applied from the gate driving circuit 440.

The TFT 120 that operates as a switching device is formed in the display area DA. The TFT 120 applies a signal voltage to pixel areas defined by the data lines and the gate lines. The pixel electrode 130 applies the signal voltage applied from the TFT 120 to the liquid crystal layer.

The second substrate 200 disposed on the first substrate 100 includes a color filter layer on which RGB pixels (not shown) are formed by a thin film process.

The driving chip 420 is mounted on the first substrate 100 corresponding to a data side of the peripheral area PA. The driving chip 420 may have two or more chips for the data lines and the gate lines, or the data lines and the gate lines can be integrated into one chip. The driving chip 420 is mounted on the first substrate 111 by a chip-on-glass (COG) process and electrically connected to the data lines DL and the gate driving circuit 440.

The gate driving circuit 440 is formed on the first substrate 100 corresponding to a gate side of the peripheral area PA. The gate driving circuit 440 is formed in the peripheral area PA of the first substrate 100 when the TFT 120 is formed. The gate driving circuit 440 may be formed inside the driving chip 420, or mounted on the peripheral area PA of the first substrate 100 as a separation chip type. In the case that the gate driving circuit 440 is formed inside the driving chip 420, the driving chip 420 is electrically connected to the gate lines GL and outputs the gate signal to the gate lines GL.

The flexible printed circuit board 460 is formed on the first substrate 100 corresponding to the data side of the peripheral area PA. The flexible printed circuit board 460 is electrically connected to a plurality of output lines OL formed on the first substrate 100. The output lines OL apply various signals outputted from the flexible printed circuit board 460 to the driving chip 420.

Figure 2:
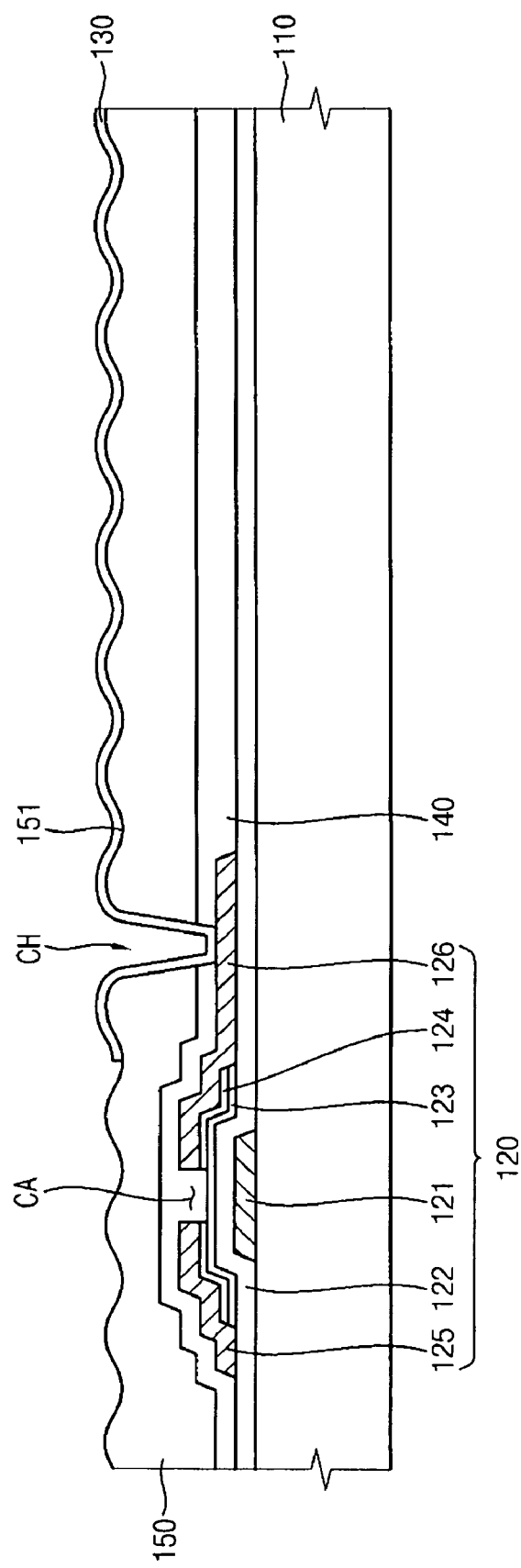
FIG. 2 is a cross-sectional view showing the first substrate illustrated in FIG. 1.

FIG. 2 is a cross-sectional view showing the first substrate illustrated in FIG. 1. Referring to FIG. 2, the first substrate 100 includes a transparent substrate 110, the TFT 120 formed on the transparent substrate 120, a passivation layer 140 formed on the transparent substrate 110 on which the TFT 120 is formed, an organic insulating layer 150 formed on the passivation layer 140, and a pixel electrode 130 formed on the organic insulating layer 150.

The TFT 120 includes a gate electrode 121 formed on the transparent substrate 110, a gate insulating layer 122 formed on the transparent substrate 110 to cover the gate electrode 121, an active layer 123 formed on the gate insulating layer 122, an ohmic contact layer 124 formed on the active layer 123, a source electrode 125 that is partially formed on the ohmic contact layer 124, and a drain electrode 126 that is also partially formed on the ohmic contact layer 124.

The gate electrode 121 is branched from one of the gate lines GL that transmits the gate signal. An example of the gate electrode 121 may include a conductive metal material, for example, such as an aluminum alloy like aluminum neodymium (AlNd), chrome (Cr), Molybdenum (Mo) and so on. In various exemplary embodiments of the present invention, the gate electrode 121 may be a single- or multi-layer structure such as a double-layer or a triple-layer structure.

The gate insulating layer 122 is formed on the transparent substrate 110 on which the gate electrode 121 is formed such that the gate insulating layer 122 also covers the gate electrode 121. The gate insulating layer 122 includes an insulating material such as silicon oxide ($SiO_2$), silicon nitride ($SiN_x$) or the like.

The active layer 123 on the gate insulating layer 122 is formed on an area corresponding to the gate electrode 121. The active layer 123 may include amorphous silicon to form an amorphous silicon TFT. The ohmic contact layer 124 on the active layer 123 includes $n^+$ amorphous silicon, and is partially removed so as to expose a center portion of the active layer 123, thereby forming a channel region CA.

The source and drain electrodes 125 and 126 are formed on the ohmic contact layer 124. The source and drain electrodes 125 and 126 may comprise a conductive metal material, for example, such as aluminum alloy like aluminum neodymium (AlNd), chrome (Cr), Molybdenum (Mo) and so on. In various exemplary embodiments of the present invention, each of the source and drain electrodes 125 and 126 may be a single- or multi-layer structure such as a double-layer or a triple-layer structure. The source electrode 125 is branched from one of the data lines DL that transmits the data signal. The source electrode 125 includes a first end disposed on the ohmic contact layer 124 and a second end disposed on the gate insulating layer 122 which is opposite to the first end. The drain electrode 126 is spaced apart from the source electrode 125 by the channel region CA. The drain electrode 126 includes a first end disposed on the ohmic contact layer 124 and a second end disposed on the gate insulating layer 122 which is opposite to the first end.

The passivation layer 140 on the TFT 140 protects the TFT 120 and various lines such as the gate lines GL, the data lines DL and the output lines OL. In an exemplary embodiment of the present invention, the passivation layer 140 includes an inorganic insulating layer such as silicon oxide ($SiO_2$), silicon nitride ($SiN_x$) or the like, and has a thickness of about 2000 angstroms.

The organic insulating layer 150 is formed on the passivation layer 140. The organic insulating layer 150 is partially exposed to form a slit shape. The passivation layer 140 and the organic insulating layer 150 are partially removed to form a contact hole CH through which the drain electrode 126 is partially exposed. The pixel electrode 130 on the organic layer 150 is electrically connected to the drain electrode 126 through the contact hole CH. According to an exemplary embodiment of the present invention the pixel electrode 130 may comprise a transparent conductive material such as indium tin oxide ITO or indium zinc oxide IZO.

Although not shown in FIGS. 1 and 2, the liquid crystal display apparatus may further include a reflection electrode formed on the pixel electrode 130 so as to reflect a light externally provided.

Figure 3:
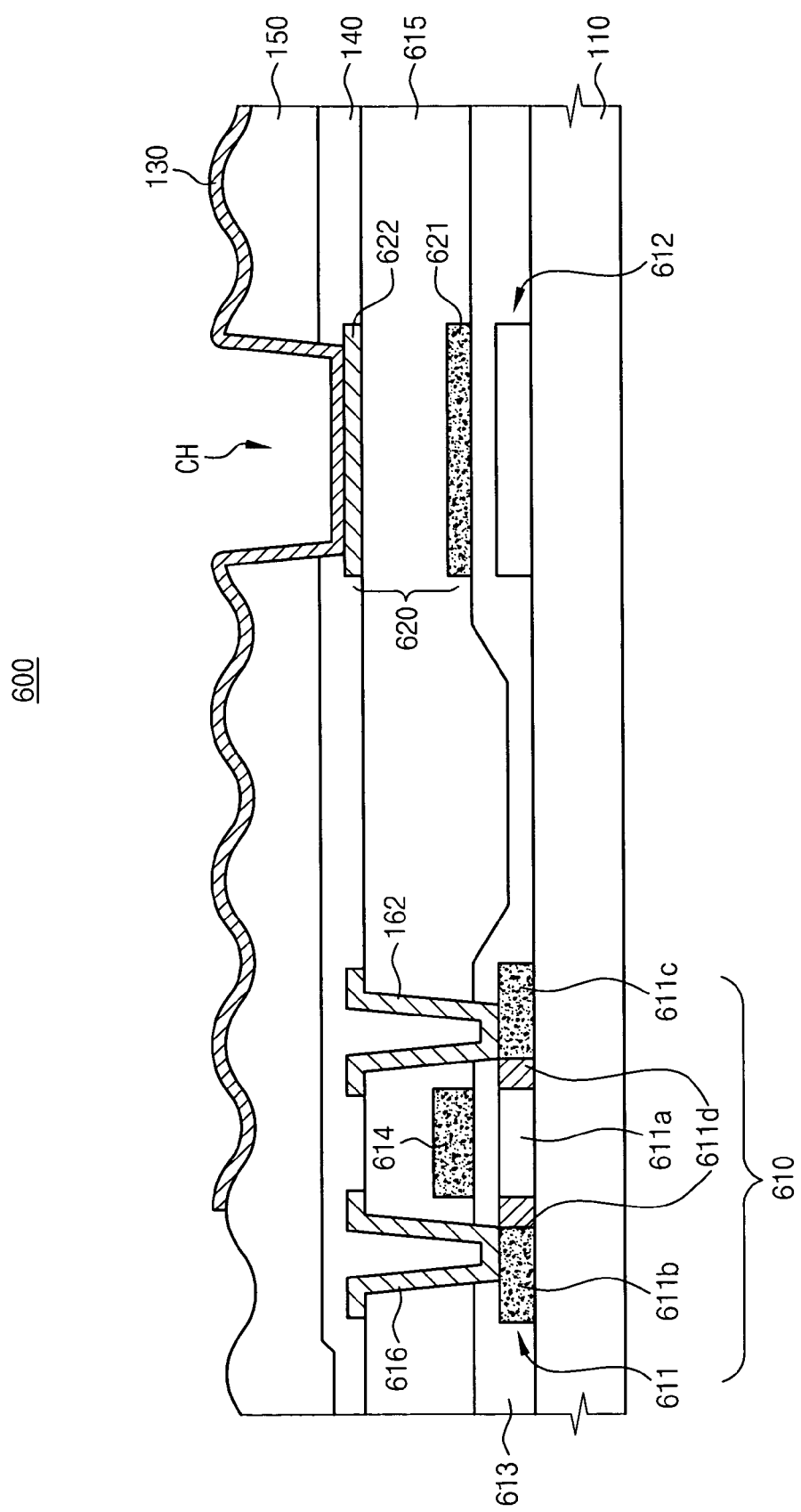
FIG. 3 is a cross-sectional view showing the first substrate according to another exemplary embodiment of the present invention.

FIG. 3 is a cross-sectional view showing a first substrate according to another exemplary embodiment of the present invention. Referring to FIG. 3, a first substrate 600 has a same function and structure as that of the first substrate 100 shown in FIG. 2 (except for a TFT 610 and a capacitor 620), and thus further description will be omitted. In FIG. 3, the same reference numerals denote the same elements as illustrated in FIG. 1.

The first substrate 600 includes a transparent substrate 110, the TFT 610 formed on the transparent substrate 110, a capacitor 620, a passivation layer 140 formed on the transparent substrate 110 and the capacitor 620, an organic insulating layer 150 formed on the passivation layer 140, and a pixel electrode 130 formed on the organic insulating layer 150.

The TFT 610 includes first and second active layers 611 and 612 formed on the transparent substrate 110, a gate insulating layer 613 formed on the transparent substrate 110 to cover the first and second active layers 611 and 612, a gate electrode 614 formed on the gate insulating layer 613, an interlayer dielectric (ILD) layer 615 formed on the gate insulating layer 613 to cover the gate electrode 614, a source electrode 616 and a drain electrode 617.

The first and second active layers 611 and 612 may include low-temperature polycrystalline silicon and are spaced from each other by a predetermined distance, thereby forming a low-temperature polycrystalline silicon TFT. The first active layer 611 includes a channel region 611a, a source region 611b and a drain layer 611c. The channel region 611a is formed in an area overlapped with the gate electrode 614, and the source and drain layer 611b and 611c are formed by implanting impurities in areas adjacent to both sides of the channel region 611a. Impurity regions 611d are formed between the channel region 611a and the source region 611b and between the channel region 611a and the drain region 611c, respectively.

The gate insulating layer 613 is formed on the transparent substrate 110 to cover the first and second active layers 611 and 612. According to an exemplary embodiment of the present invention, the gate insulating layer 613 has a thickness of about 1000 angstroms.

The gate lines GL, the gate electrode 614 and a first electrode 621 of the capacitor 620 are formed on the gate insulating layer 613. The gate electrode 614 is formed on the gate insulating layer 613 corresponding to the first active layer 611, and the first electrode 621 of the capacitor 620 is formed on the gate insulating layer 613 corresponding to the second active layer 612.

The ILD layer 615 is formed on the gate insulating layer 613 on which the gate lines GL, the gate electrode 614 and the first electrode 621 are formed. The ILD layer 615 may be a single layer comprising silicon oxide ($SiO_2$) or a double layer comprising silicon oxide ($SiO_2$) and silicon nitride ($SiN_x$). The gate insulating layer 613 and the ILD layer 615 are partially removed to expose the source and drain regions 611b and 611c of the first active layer 611.

The data lines DL, source electrode 616 branched from the data lines DL, drain electrode 617 and a second electrode 622 of the capacitor 622 are formed on the ILD layer 615. The source electrode 616 is electrically connected to the source region 611b of the first active layer 611, and the drain electrode 617 is electrically connected to the drain region 611c of the first active layer 611. The second electrode 622 of the capacitor 620 is formed on the ILD layer 615 such that the second electrode 622 is overlapped with the first electrode 621. Thus, the ILD layer 615 disposed between the first and second electrodes 621 and 622 acts as a dielectric layer of the capacitor 620.

The passivation layer 140 and the organic insulating layer 150 are sequentially formed on the ILD layer 615 on which the source electrode 616, the drain electrode 617 and the second electrode 622 are formed. The organic insulating layer 150 and the passivation layer 140 are sequentially partially removed to expose the second electrode 622 through a contact hole CH. In an embodiment of the present invention, the passivation layer 140 has a thickness of about 2000 angstroms and the organic insulating layer 150 has a thickness of about 3.6 micrometers.

The pixel electrode 130 is formed on the organic layer 150. The pixel electrode 130 is electrically connected to the drain electrode 126 through the contact hole. Although not shown in FIG. 3, the liquid crystal display apparatus may further include a reflection electrode formed on the pixel electrode 130 so as to reflect a light externally provided.

Figure 4:
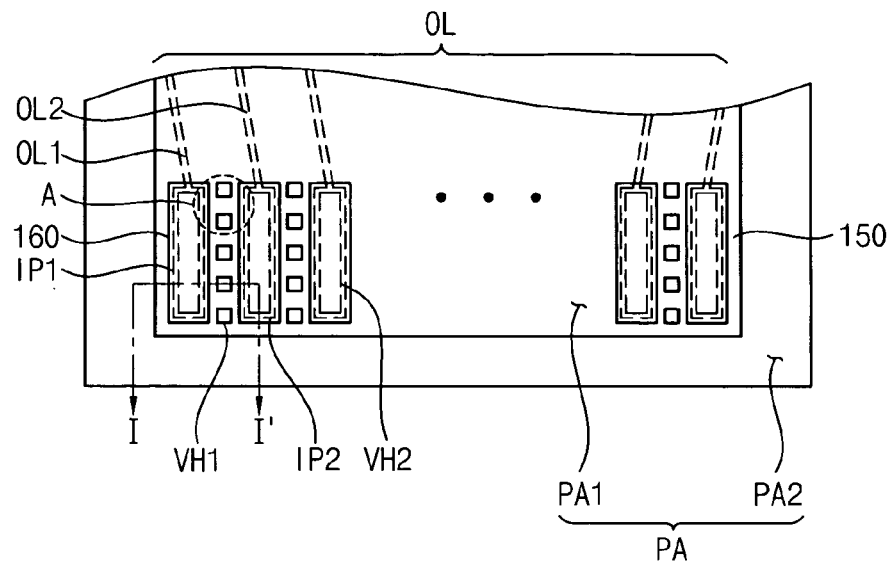
FIG. 4 is a plan view showing a peripheral area of the first substrate illustrated in FIG. 1.

FIG. 4 is a plan view showing a peripheral area of the first substrate illustrated in FIG. 1. Referring to FIGS. 1 and 4, the peripheral area PA includes a first peripheral area PA1 in which the output lines OL are formed and a second peripheral area PA2 in which the output lines OL are not formed that is adjacent to the first peripheral area PA1. The flexible printed circuit board 460 is attached to the first and second peripheral area PA1 and PA2.

The output lines OL are spaced apart from each other. Each of the output lines OL includes a pad formed at a first end thereof adjacent to the flexible printed circuit board 460. The pad is electrically connected to the flexible printed circuit board 460. Although not shown in FIG. 4, each of the output lines OL also includes a pad formed at a second end thereof adjacent to the driving chip 420; the pads are electrically connected to the driving chip 420.

The organic insulating layer 150 is formed on the output lines OL. The organic insulating layer 150 is formed in the first peripheral area PA1 so as to protect the output lines OL. Although not shown in FIG. 4, the passivation layer 140 under the organic insulating layer 150 is formed in the first peripheral area PA1. The organic insulating layer 150 is partially removed to form a plurality of first via holes VH1 between pads adjacent to each other. Thus, a portion of the organic insulating layer 150 between a first pad IP1 and a second pad IP2 is partially removed, so that the first vial holes VH1 is formed between the first pad IP1 and the second pad IP2.

The first output line OL1 and the second output line OL2 adjacent to the first output line OL1 include the first pad IP1 and the second pad IP2 formed at ends thereof, respectively. When the organic insulating layer 150 is partially removed, a plurality of via holes VH1 is formed between the first pad IP1 of the first output line OL1 and the second pad IP2 of the output line OL2.

Figure 5:
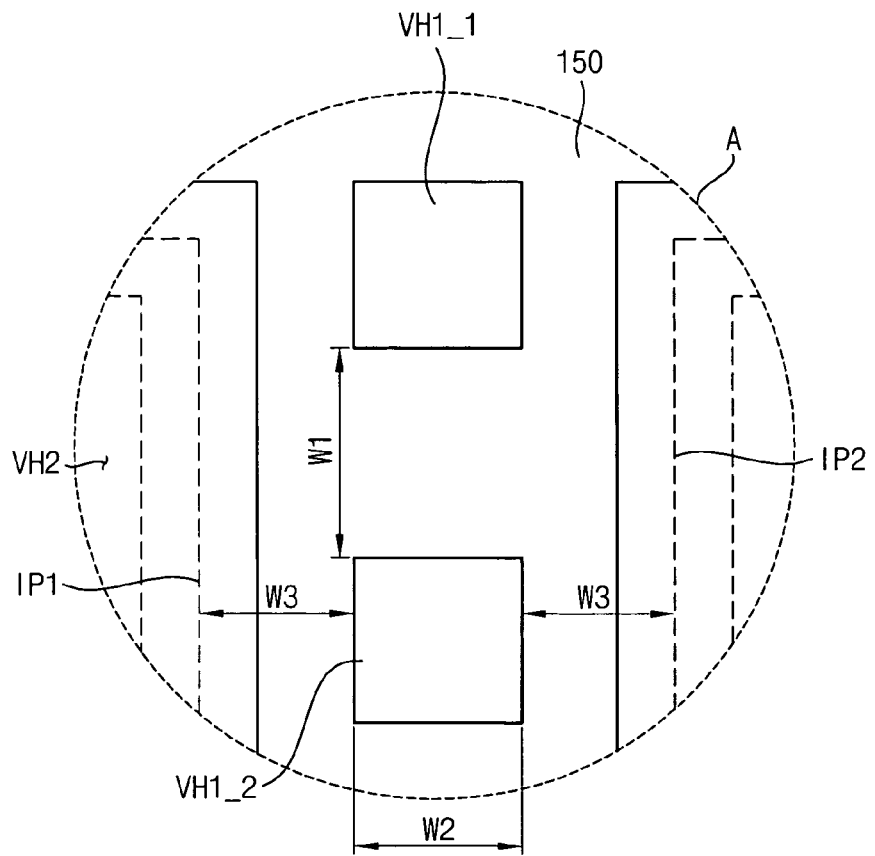
FIG. 5 is an enlarged plan view of the portion 'A' in FIG. 4.

Although not shown in FIG. 5, the first via holes VH1 are also formed at the second end of the output lines OL and ends of the data lines DL.

The organic insulating layer 150 is partially removed to expose the pads connected to first ends of the output lines OL through a plurality of second via holes VH2. Thus, the first and second pads IP1 and IP2 are exposed through the second via holes VH2.

A plurality of transparent electrodes 160 is formed on the organic insulating layer 150 and electrically connected to the pads formed at the first end of the output lines OL. The transparent electrodes 160 include a same material as the pixel electrode 130 and are in a one-to-one relation with the pads formed at the first end of the output lines OL.

FIG. 5 is an enlarged plan view of a portion 'A' in FIG. 4. Referring to FIG. 5, two first via holes VH1_1 and VH1_2 adjacent to each other are spaced apart from each other by a predetermined distance. In case that the two first via holes VH1_1 and VH1_2 are so close to each other, the organic insulating layer 150 formed between the two first via holes VH1_1 and VH1_2 may be separated from a lower layer thereunder. In order to prevent the separation of the organic insulating layer 150, an interval W1 between the two first via holes VH1_1 and VH1_2 is equal to or greater than about 70% of a width W2 of one of the first via holes VH1.

In case that the first via holes VH1 and the second via hole VH2 are so close to each other, the organic insulating layer 150 formed between the first via holes VH1 and the second via holes VH2 may be separated from the lower layer thereunder. To prevent the separation of the organic insulating layer 150, according to an exemplary embodiment of the present invention, an interval W3 between the first via holes VH1 and the first pad IP1 and between the first via holes VH1 and the second pad IP2 is equal to or greater than about 70% of the width W2 of one of the first via holes VH1.

Figure 6:
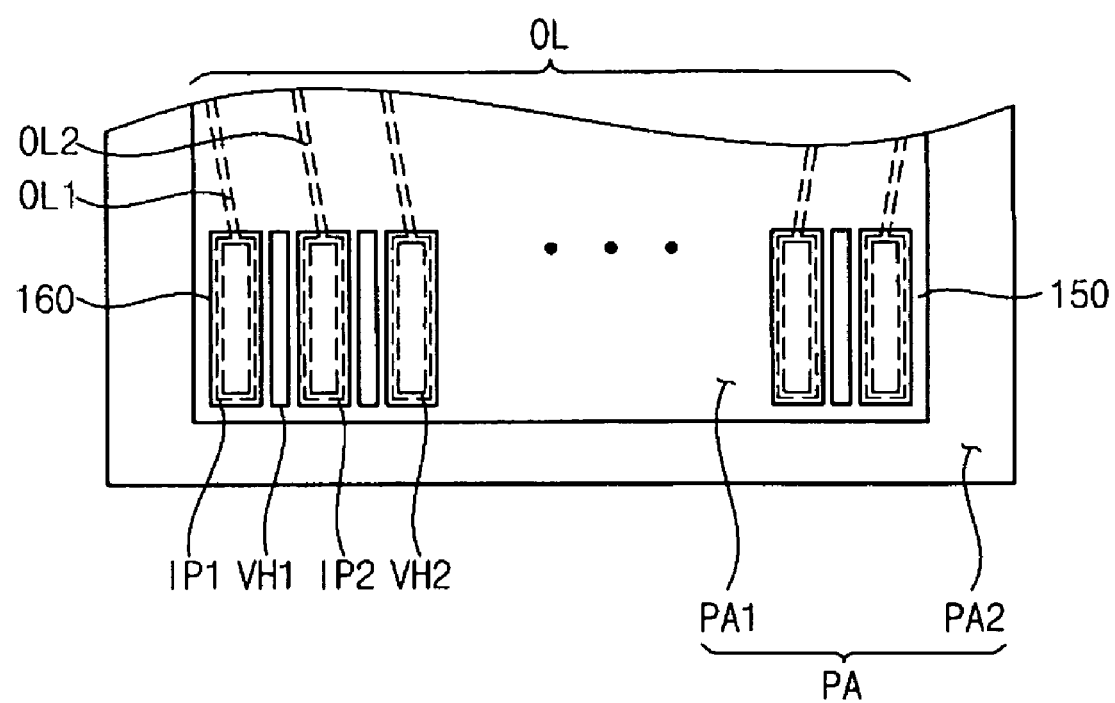
FIG. 6 is a plan view showing another exemplary embodiment of a peripheral area of the first substrate illustrated in FIG. 4.

FIG. 6 is a plan view showing another exemplary embodiment of a peripheral area of a first substrate in FIG. 4. Referring to FIG. 6, the first via hole VH1 is disposed between two pads IP1 and IP2 adjacent to each other and extended along a longitudinal direction of the pads IP1 and IP2. In the present embodiment, only one first via hole among the first via holes VH1 is disposed between two pads, for example, first and second pads IP1 and IP2 adjacent to each other. The first via hole has a length substantially identical with that of the pads IP1 and IP2.

Figure 7:
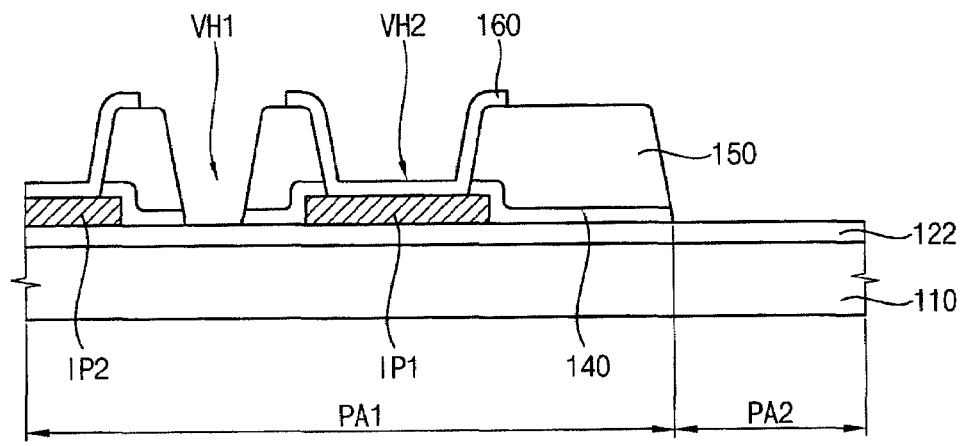
FIG. 7 is a cross-sectional view taken along a line I-I' showing the peripheral area of the first substrate illustrated in FIG. 4.

FIG. 7 is a cross-sectional view taken along a line I-I' showing the peripheral area of the first substrate illustrated in FIG. 4. In the present embodiment, a first output line OL1 among the output lines OL and the first pad IP1 will be described since the output lines OL and the first pad IP1 have same function and structure. Referring to FIGS. 4 and 7, the first output line OL1 is formed on the gate insulating layer 122 on the transparent substrate 110. The first pad IP1 formed at the first end of the first output line OL1 is formed in the first peripheral area PA1.

The passivation layer 140 and the organic insulating layer 150 are formed on the gate insulating layer 122 on which the first output line OL1 is formed. The passivation layer 140 and the organic insulating layer 150 are partially removed to form the first and second via holes VH1 and VH2.

The transparent electrode 160 formed on the organic insulating layer 150 is electrically connected to the first pad IP1.

Figure 8:
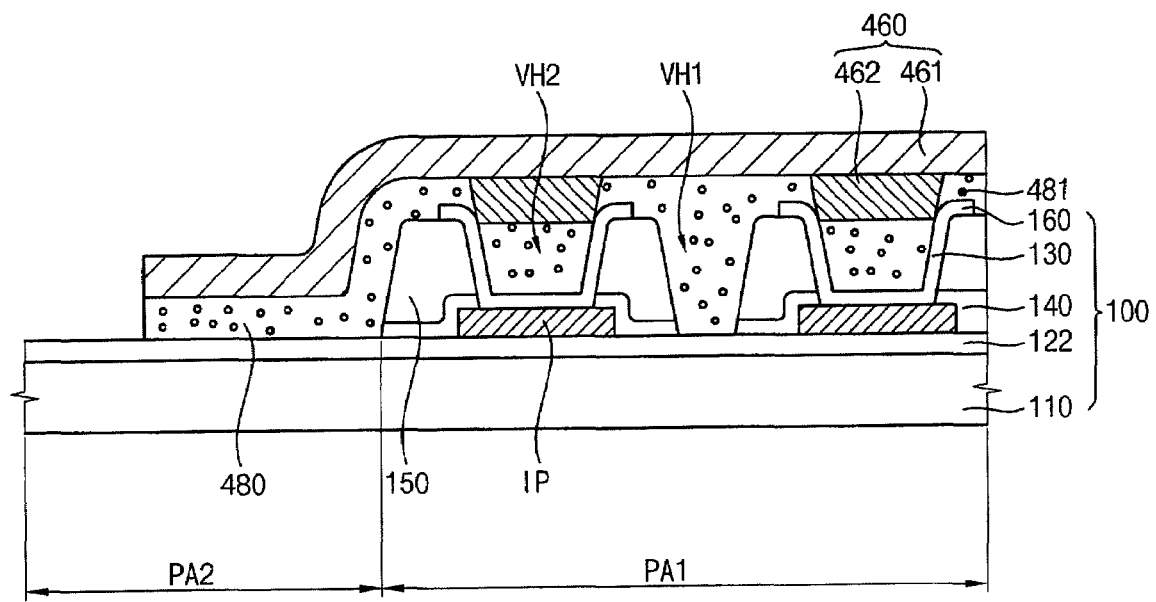
FIG. 8 is a cross-sectional view showing a first substrate coupled to a flexible printed circuit board illustrated in FIG. 1.

FIG. 8 is a cross-sectional view showing the first substrate coupled to a flexible printed circuit board illustrated in FIG. 1. Referring to FIG. 8, the flexible printed circuit board 460 is attached to the first and second peripheral areas PA1 and PA2 of the first substrate 100. The flexible printed circuit board 460 includes a base substrate 461 and wires (not shown) formed on the base substrate 461 to transmit various signals. The wires include a plurality of output pads 462 electrically connected to the pads IP. The output pads 462 are in a one-to-one relationship with the pads IP.

An anisotropic conductive film ACF 480 is disposed between the first substrate 100 and the flexible printed circuit board 460. The anisotropic conductive film 480 includes an adhesive material that allows the flexible printed circuit board 460 to adhere to the first substrate 100. The anisotropic conductive film 480 includes conductive particles 481, and the conductive particles 481 electrically connect the output pads and the transparent electrode 160 with each other.

When the first via hole VH1 is formed between the pads IP as shown in FIG. 8, the anisotropic conductive film 480 may not be easily separated from the first substrate 100 since a step-difference between areas in which the pads are formed and areas between the pads IP is reduced due to the presence of the first via hole VH1. Thus, an area in which the second via hole VH2 is formed has a thinner thickness than the area between the pads IP adjacent to the second via hole VH2 because of the removal of the passivation layer 140 and the organic insulating layer 150.

Thus, the anisotropic conductive film 480 on in the second via hole VH2 may be separated from the first substrate 110. Due to formation of the first via hole VH1, the step-difference between the areas in which the pads are formed and the areas between the pads IP may be reduced, thereby preventing the separation of the anisotropic conductive film 480 from the first substrate 110. As a result, the liquid crystal display apparatus 600 may enhance the coupling force between the flexible printed circuit board 460 and the first substrate 100 and improve production yield thereof.

In the second peripheral area PA2, the passivation layer 140 and the organic insulating layer 150 are completely removed since the pads IP are not formed therein. Thus, the anisotropic conductive film 480 is directly adhered to the gate insulating layer 122 on the transparent substrate 100. As a result, the liquid crystal display apparatus 600 may also enhance the coupling force between the flexible printed circuit board 460 and the first substrate 100 and improve production yield thereof.

Figure 9A:
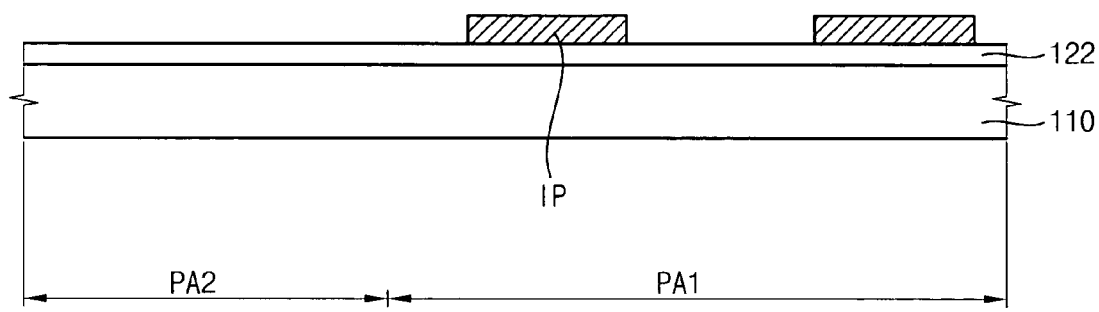
FIGS. 9A to 9E are views illustrating a method of manufacturing the liquid crystal display apparatus illustrated in FIG. 8.

FIGS. 9A to 9E are views illustrating a method of manufacturing the liquid crystal display apparatus illustrated in FIG. 8. Referring to FIG. 9A, the gate insulating layer 122 and a conductive metal material are sequentially deposited on the transparent substrate 110. The conductive metal material is patterned by a photolithography process to form the output lines OL (refer to FIG. 4) and the pads IP at the first end of the output lines OL corresponding to the first peripheral area PA. Although not shown in figures, the output lines OL are substantially simultaneously formed with the data lines DL (refer to FIG. 1), the source electrode 125 and the drain electrode 126.

Figure 9B:
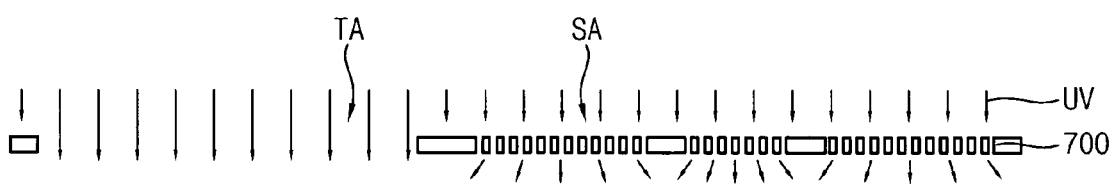
Figure 9B:
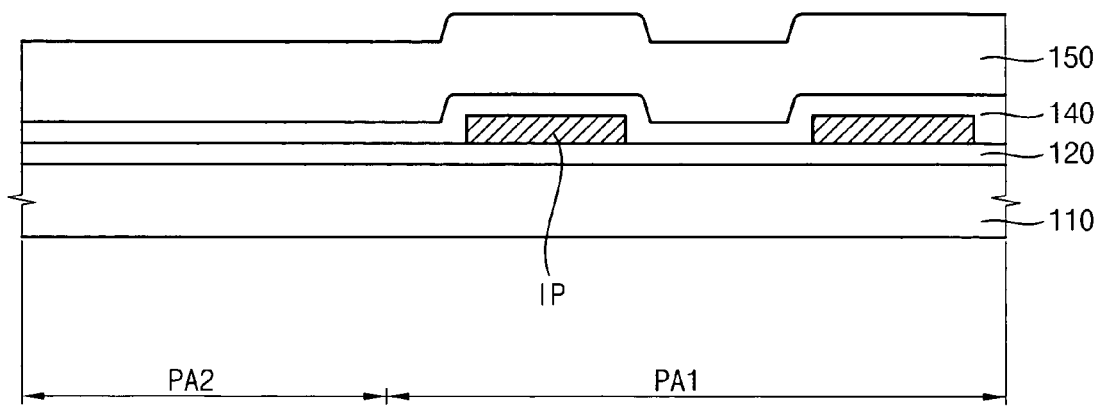
Figure 9C:
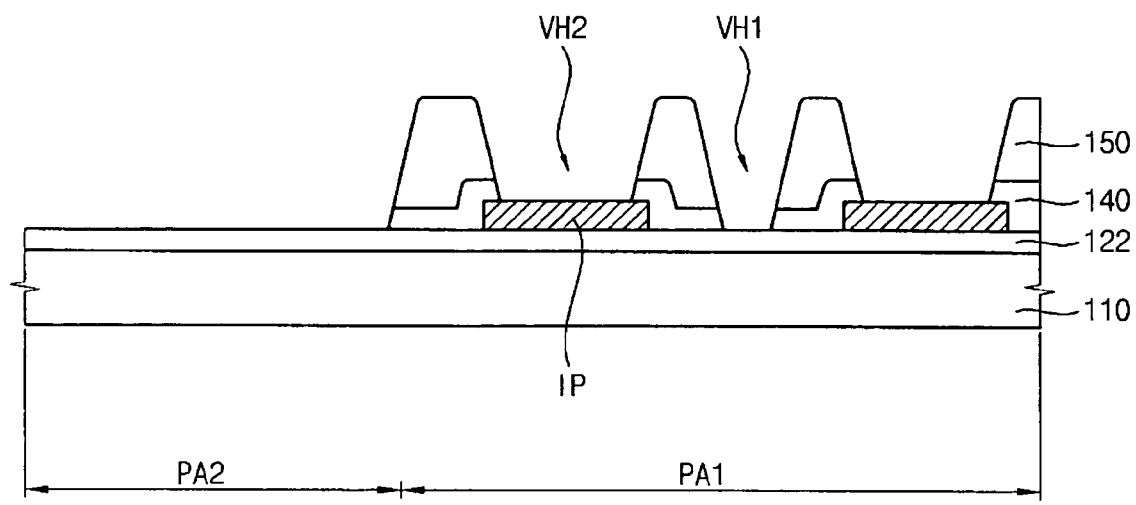

Referring to FIGS. 9B and 9C, the passivation layer 140 and the organic insulating layer 150 are sequentially deposited on the gate insulating layer 122 on which the pads IP are formed. The organic insulating layer 150 is exposed using a slit mask 700 having a slit portion SA through which ultraviolet lights are partially transmitted and a transmission portion TA through which the ultraviolet lights are substantially completely transmitted. The slit portion SA corresponds to areas in which the first and second via holes VH_1 and VH_2 are formed, and the transmission portion corresponds to the second peripheral area PA2.

The passivation layer 140 and the organic insulating layer 150 are patterned by a photolithography process using the slit mask 700 such that the passivation layer 140 corresponding to the second peripheral area PA are completely removed and the first and second via holes VH_1 and VH_2 are formed in the first peripheral area PA1.

Figure 9D:
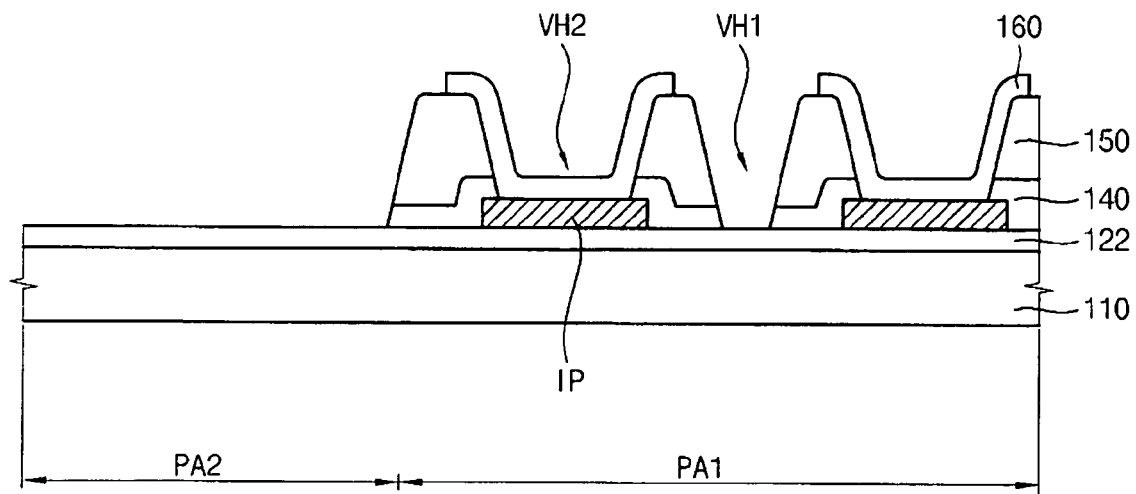

Referring to FIG. 9D, a transparent conductive metal material is coated on the transparent substrate 110 on which the passivation layer 140 and the organic insulating layer 150. When the conductive metal material is patterned, the transparent electrode 160 covering the second via hole VH2 is formed. Although not shown in figures, the conductive metal material placed on an area corresponding to the display area DA is also patterned to form the pixel electrode 130.

Figure 9E:
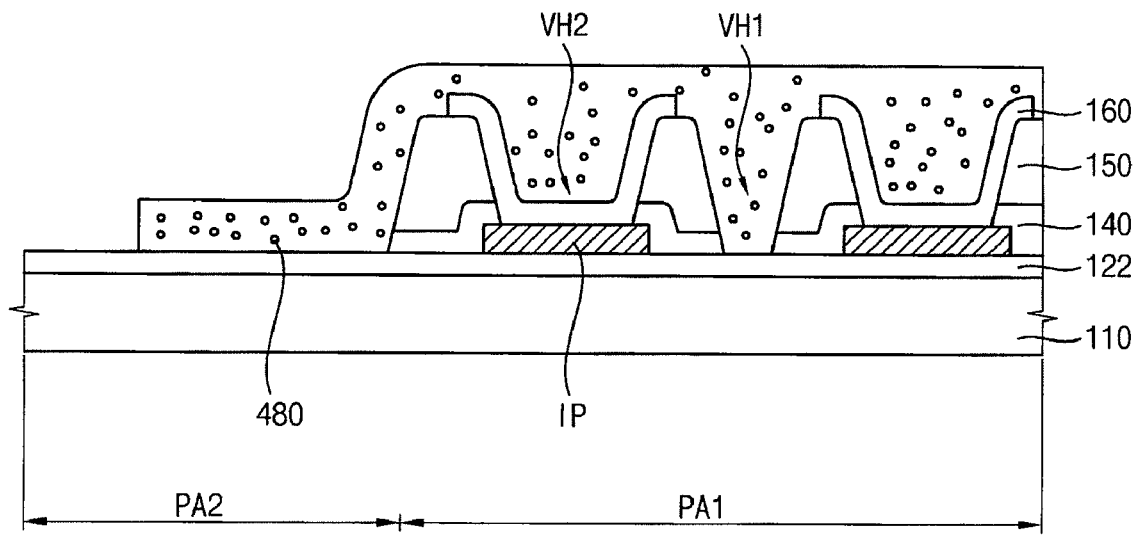

Referring to FIG. 9E, the anisotropic conductive film 480 is attached on the first and second peripheral areas PA1 and PA2 of the first substrate 100 on which the transparent electrode 160 is formed, and the flexible printed circuit board 460 is attached to the anisotropic conductive film 480.

Figure 10:
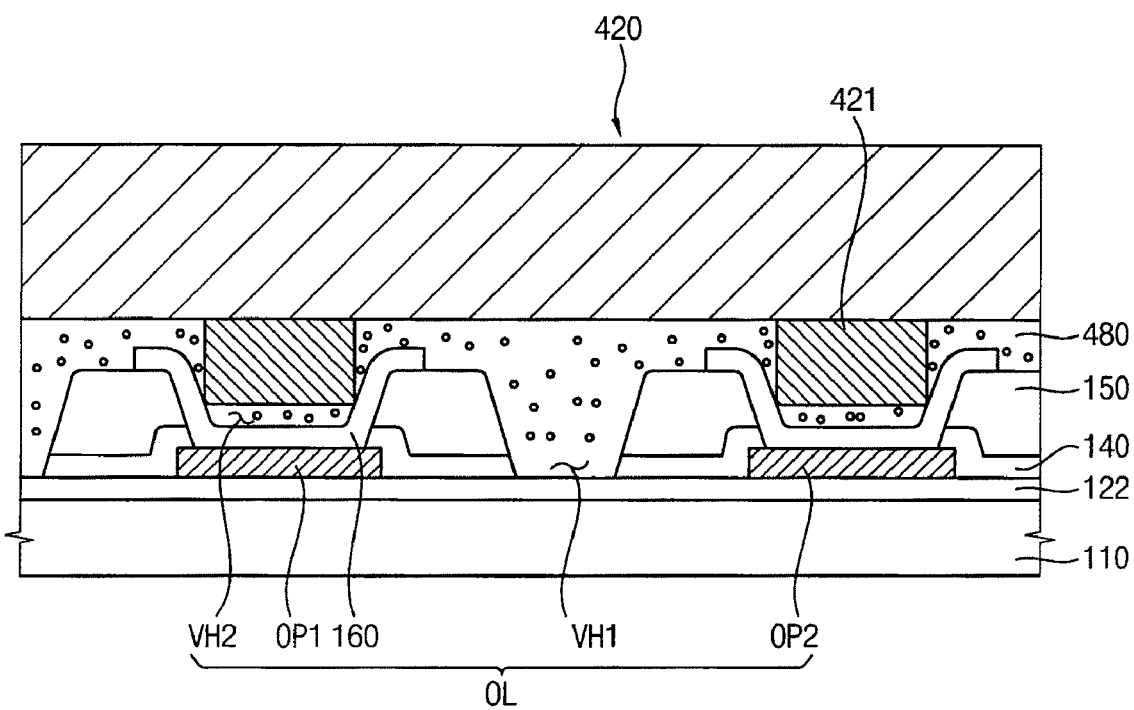
FIG. 10 is a cross-sectional view showing the first substrate coupled to the driving chip illustrated in FIG. 1.

FIG. 10 is a cross-sectional view showing the first substrate coupled to a driving chip illustrated in FIG. 1. Referring to FIG. 10, the output lines OL is formed on the gate insulating layer 122 formed on the transparent substrate 110. The pads OP formed at the second end of the output lines OL are adjacent to the driving chip 420.

The passivation layer 140 and the organic insulating layer 150 are formed on the gate insulating layer 122 on which the output lines OL are formed. The passivation layer 140 and the organic insulating layer 150 between two pads OP adjacent to each other are partially removed to form the first via holes VH1. The passivation layer 140 and the organic insulating layer 150 on the pads OP are partially removed such that the pads OP are partially exposed through the second via holes VH2.

The transparent electrode 160 on the organic insulating layer 150 is electrically connected to the pads OP through the second via hole VH2.

The driving chip 420 is attached to an area in which the pads OP are formed. The driving chip 420 includes output pads 421 electrically connected to the pads OP.

The anisotropic conductive film 480 is disposed between the first substrate 100 and the driving chip 420. The anisotropic conductive film 480 allows the driving chip 420 to adhere to the first substrate 100 and electrically connects the output lines 421 and the transparent electrode 160 on the pads OP.

Due to formation of the first via hole VH1, the step-difference between the areas in which the pads OP are formed and the areas between the pads OP may be reduced, thereby preventing the separation of the anisotropic conductive film 480 from the first substrate 100. As a result, the liquid crystal display apparatus 600 may enhance the coupling force between the driving circuit 420 and the first substrate 100 and improve production yield thereof.

According to the above, the organic insulating layer is partially removed to form the via holes between the pads of the output lines on the first substrate. The step-difference between the areas in which the pads are formed and the areas in which the pads are not formed may be reduced due to the presence of the via hole so that the anisotropic conductive film may be stably adhered to the first substrate. Thus, the liquid crystal display apparatus may enhance the coupling force between the flexible printed circuit board and the first substrate and between the driving chip and the first substrate.

Accordingly, due to enhancement of the coupling force between the flexible printed circuit board and the first substrate and between the driving chip and the first substrate, the first substrate may stably receive various signals needed to display the image. Therefore, the liquid crystal display apparatus may prevent the image from being displayed abnormally and improve production yield thereof.

Although the processes and apparatus of the present invention have been described in detail with reference to the accompanying drawings for the purpose of illustration, it is to be understood that the inventive processes and apparatus are not to be construed as limited thereby. It will be readily apparent to those of reasonable skill in the art that various modifications to the foregoing exemplary embodiments may be made without departing from the spirit and scope of the invention as defined by the appended claims.

What is claimed is:

1. A display apparatus comprising:
  a display panel comprising:
    a substrate having a display area to display an image in response to an image signal and a peripheral area adjacent to the display area;
    a plurality of signal transmitting lines to transmit the image signal, the signal transmitting lines being formed on the substrate and having pads formed at ends thereof, respectively;
    an organic insulating layer formed on the substrate to cover the signal transmitting lines, the organic insulating layer being partially removed from a corresponding area between the pads so as to form a first via hole; and
  a signal generator to apply the image signal to the signal transmitting lines, the signal generator being disposed in the peripheral area and electrically connected to the pad,
  wherein the peripheral area includes a first peripheral area in which the pads are arranged and a second peripheral area situated on an edge of the first peripheral area, the pads being not formed in the second peripheral area,
  wherein a portion of the organic insulating layer in the second peripheral area is removed along an arranged direction of the pads, and a length of the removed organic insulating layer in the second peripheral area is longer than an interval between at least three adjacent pads.

2. The display apparatus of claim 1, further comprising a conductive adhesive member to affix the signal generator to the substrate.

3. The display apparatus of claim 2, wherein the conductive adhesive member comprises an anisotropic conductive material.

4. The display apparatus of claim 1, wherein the first via hole has a shape extended in a longitudinal direction of the pad.

5. The display apparatus of claim 1, wherein at least two first via holes are formed between the pads adjacent to each other.

6. The display apparatus of claim 5, wherein an interval between the first via holes adjacent to each other is equal to or greater than about 70% of a width of the first via hole.

7. The display apparatus of claim 1, wherein an interval between the pad and the first via hole is equal to or greater than about 70% of the width of the first via hole.

8. The display apparatus of claim 1, wherein the signal generator is a semiconductor chip.

9. The display apparatus of claim 1, wherein the signal generator is a flexible printed circuit board.

10. The display apparatus of claim 1, wherein the display panel further comprises a switching device formed in the display area of the first substrate and electrically connected to the signal transmitting lines, and wherein the switching device is formed under the organic insulating layer.

11. The display apparatus of claim 10, wherein the organic insulating layer on the pads is removed to form a second via hole, such that the pads are exposed through the second via hole.

12. The display apparatus of claim 10, wherein the switching device comprises low-temperature polycrystalline silicon thin film transistor.

13. The display apparatus of claim 10, wherein the switching device comprises an amorphous silicon thin film transistor.

14. The display apparatus of claim 1, wherein the display panel further comprises a transparent electrode formed on the organic insulating layer to electrically connect the signal transmitting lines to the signal generator.

* * * * *

UNITED STATES PATENT AND TRADEMARK OFFICE
CERTIFICATE OF CORRECTION

PATENT NO. : 7,636,145 B2  Page 1 of 1
APPLICATION NO. : 11/353823
DATED : December 22, 2009
INVENTOR(S) : Jung et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 983 days.

Signed and Sealed this

Ninth Day of November, 2010

David J. Kappos
*Director of the United States Patent and Trademark Office*